US011726132B2

(12) United States Patent
Sozer et al.

(10) Patent No.: US 11,726,132 B2
(45) Date of Patent: Aug. 15, 2023

(54) MONITORING POWER SYSTEMS UTILIZING PHASE LOCKED LOOP AND RF EMISSIONS, AND HIGH FREQUENCY ENVELOPE DETECTOR FOR SAME

(71) Applicants: Yilmaz Sozer, Peninsula, OH (US); Jose Alexis De Abreu-Garcia, Akron, OH (US); Mohammad Arifur Rahman, Akron, OH (US)

(72) Inventors: Yilmaz Sozer, Peninsula, OH (US); Jose Alexis De Abreu-Garcia, Akron, OH (US); Mohammad Arifur Rahman, Akron, OH (US)

(73) Assignee: The University of Akron, Akron, OH (US)

( * ) Notice: Subject to any disclaimer, the term of this patent is extended or adjusted under 35 U.S.C. 154(b) by 121 days.

(21) Appl. No.: 17/331,999

(22) Filed: May 27, 2021

(65) Prior Publication Data

US 2021/0373066 A1 Dec. 2, 2021

Related U.S. Application Data

(60) Provisional application No. 63/057,674, filed on Jul. 28, 2020, provisional application No. 63/031,180, filed on May 28, 2020.

(51) Int. Cl.
*G01R 31/12* (2020.01)
*H03F 3/24* (2006.01)
(Continued)

(52) U.S. Cl.
CPC ......... *G01R 31/1272* (2013.01); *G01R 31/40* (2013.01); *H03F 1/0233* (2013.01);
(Continued)

(58) Field of Classification Search
CPC ............ G01R 31/1272; G01R 31/40; G01R 31/1245; H03F 1/0233; H03F 3/245; H03F 2200/105; H03F 2200/451
(Continued)

(56) References Cited

U.S. PATENT DOCUMENTS 3,878,334 A * 4/1975 Halpern .................... H03L 7/08
375/376
6,650,226 B1 * 11/2003 Wuidart ............... G06K 7/0008
340/439
(Continued)

OTHER PUBLICATIONS

Dasari et al.; Phase Locked Loop Based Signal Processing Approach for the Health Monitoring of Power Systems through their RF Emission; IEEE PES Conference; Aug. 2019.

*Primary Examiner* — Giovanni Astacio-Oquendo
(74) *Attorney, Agent, or Firm* — Renner Kenner Greive Bobak Taylor & Weber

(57) ABSTRACT

A failure detection system for an energy network includes a radio frequency (RF) receiver adapted to be coupled with or in close proximity to the energy network, the RF receiver providing an amplitude modulated RF signal; an RF amplifier receiving the amplitude modulated RF signal and providing an amplified signal; an envelope detector receiving the amplitude modulated RF signal and providing a demodulated envelope signal; an optional algorithm implementation system receiving the demodulated envelope signal, where the optional algorithm implementation system processes the demodulated envelope signal by one or more of a Fast Fourier transform (FFT) trigger system and a phase-locked loop (PLL) trigger system; and a signature output that is the overall output signal of the failure detection system, wherein the signature output is adapted to indicate whether the energy network is experiencing partial discharge.

15 Claims, 14 Drawing Sheets

(51) Int. Cl.
   *G01R 31/40* (2020.01)
   *H03F 1/02* (2006.01)
(52) U.S. Cl.
   CPC ....... *H03F 3/245* (2013.01); *H03F 2200/105* (2013.01); *H03F 2200/451* (2013.01)
(58) Field of Classification Search
   USPC .................................. 324/764.01, 537, 500
   See application file for complete search history.

(56) References Cited

U.S. PATENT DOCUMENTS

| | | | |
|---|---|---|---|
| 7,554,335 B2* | 6/2009 | Han ................... | G01R 31/2822 |
| | | | 324/537 |
| 7,817,040 B2 | 10/2010 | Homanfar et al. | |
| 8,604,837 B2 | 12/2013 | Nakamoto | |
| 8,854,124 B2 | 10/2014 | Chung | |
| 9,360,504 B2 | 6/2016 | Pillin et al. | |
| 10,630,238 B2 | 4/2020 | Ikeda et al. | |
| 10,670,700 B2 | 6/2020 | McMahon et al. | |
| 2010/0150284 A1* | 6/2010 | Fielder ................ | H04B 1/3805 |
| | | | 375/345 |
| 2012/0139632 A1* | 6/2012 | Mineyama ............... | H03F 1/56 |
| | | | 330/253 |
| 2017/0052222 A1 | 2/2017 | Pasdar et al. | |
| 2017/0227596 A1 | 8/2017 | Sozer et al. | |

* cited by examiner

For even harmonics, $v_0(t) = v(t) - v\left(t - \frac{\pi}{3}\right)$ ............ Eq. (1)

FIG. 11

For odd harmonics, $v_{0\to h}(t) = v(t) + v\left(t - \frac{\pi}{h\omega}\right)$ ..........

Eq. (2) where h is the order of the odd harmonic

FIG. 12

MONITORING POWER SYSTEMS UTILIZING PHASE LOCKED LOOP AND RF EMISSIONS, AND HIGH FREQUENCY ENVELOPE DETECTOR FOR SAME

CROSS-REFERENCE TO RELATED APPLICATIONS

This application claims the benefit of U.S. Provisional Application No. 63/057,674, filed on Jul. 28, 2020, and U.S. Provisional Application No. 63/031,180, filed on May 28, 2020, which are each incorporated herein by reference.

FIELD OF THE INVENTION

Embodiments of the present invention relate to a failure detection system for an energy network. One or more embodiments relate to a phase locked loop algorithm. One or more embodiments relate to a high frequency radio frequency (RF) emissions envelope detector.

BACKGROUND OF THE INVENTION

Power system health monitoring is a crucial issue as partial discharge (PD) and insulation failures become more prevalent due to the effects of wear and tear as well as climate change on the aging grid. Further, due to increased power demand, there is a need to supply reliable, sustainable, and affordable power to customers. This includes meeting customer needs by monitoring power system equipment at various levels from the point of generation to the point of consumption. The partial discharge damages the insulation equipment and radiates radio frequency (RF) emissions. Detecting these RF emissions has proven to be an effective approach to diagnose equipment deterioration.

The harmonic content of RF emissions from power system components can be a good indicator of equipment deterioration. Fast Fourier transform (FFT) methods have been used to determine this harmonic content of the RF emissions. However, these methods generally require computationally intensive algorithms to determine the harmonic content.

There remains a need in the art for a cost-effective and quick failure detection system for energy networks.

SUMMARY OF THE INVENTION

An embodiment of the present invention provides a failure detection system for an energy network, the failure detection system including a radio frequency (RF) receiver adapted to be coupled with or in close proximity to the energy network, the RF receiver providing an amplitude modulated RF signal; an RF amplifier receiving the amplitude modulated RF signal and providing an amplified signal; an envelope detector receiving the amplitude modulated RF signal and providing a demodulated envelope signal; an optional algorithm implementation system receiving the demodulated envelope signal, where the optional algorithm implementation system processes the demodulated envelope signal by one or more of a Fast Fourier transform (FFT) trigger system and a phase-locked loop (PLL) trigger system; and a signature output that is the overall output signal of the failure detection system, wherein the signature output is adapted to indicate whether the energy network is experiencing partial discharge.

Another embodiment of the present invention provides a method of operating the failure detection system of the above embodiment, the method including steps of providing the failure detection system, wherein the failure detection system is coupled with or in close proximity to the energy network; establishing a predetermined setpoint of the energy network; and comparing the signature output of the energy network to the predetermined setpoint of the energy network.

A further embodiment of the present invention provides an envelope detector for determining partial discharge content from an energy network, the envelope detector including a diode, a capacitor, and a resistor, wherein the envelope detector detects high frequency radio frequency (RF) emissions from the energy network.

DETAILED DESCRIPTION OF ILLUSTRATIVE EMBODIMENTS

Advantages of the present invention will become better understood with regard to the following description, appended claims, and accompanying drawings wherein:

FIG. 11 is an equation utilized in the system according to one or more embodiments of the invention;

FIG. 12 is an equation utilized in the system according to one or more embodiments of the invention;

DETAILED DESCRIPTION OF ILLUSTRATIVE EMBODIMENTS

Figure 1:
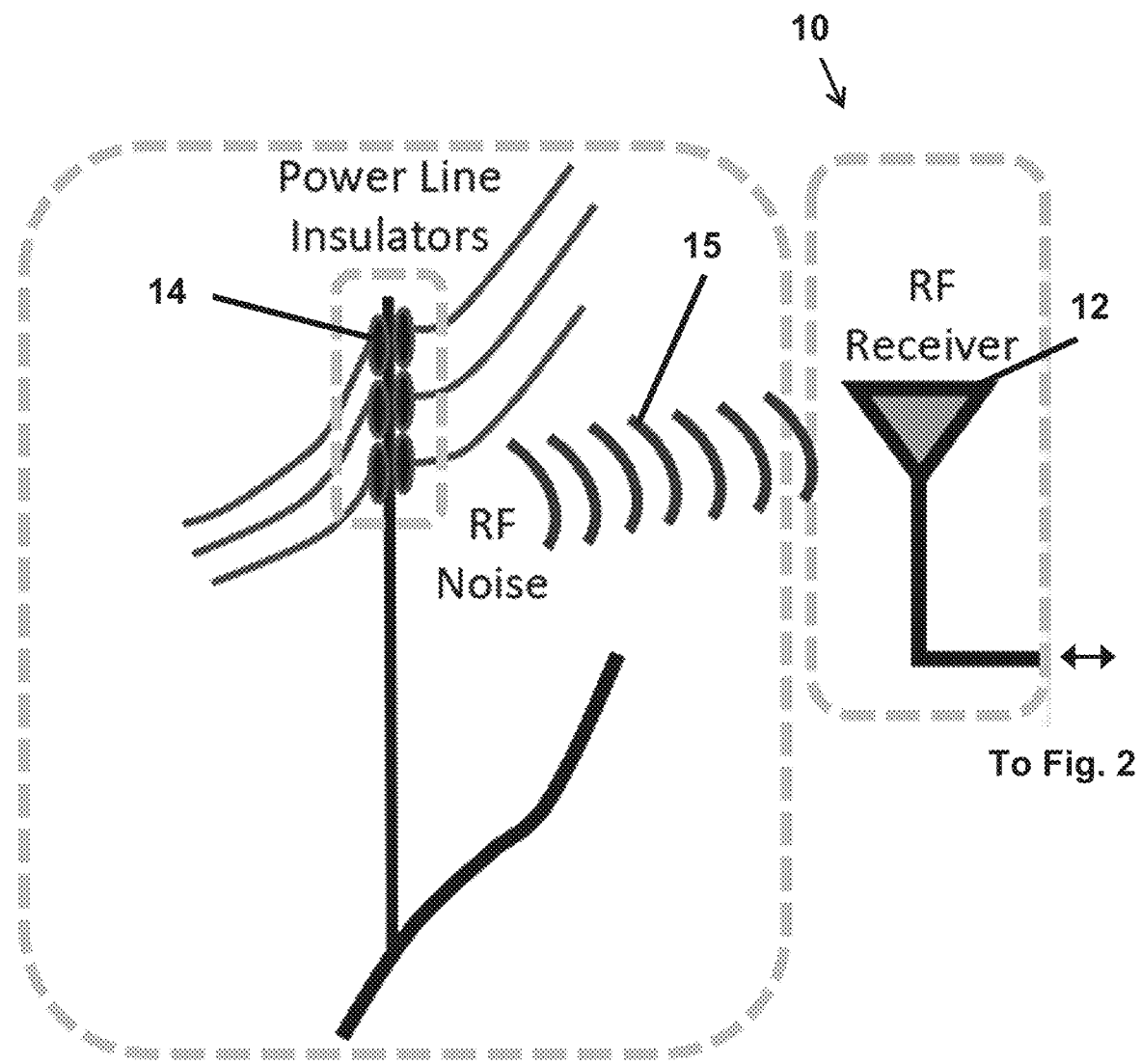
FIG. 1 is a schematic of a portion of a system according to one or more embodiments of the invention, showing an energy network and an RF receiver.
Figure 2:
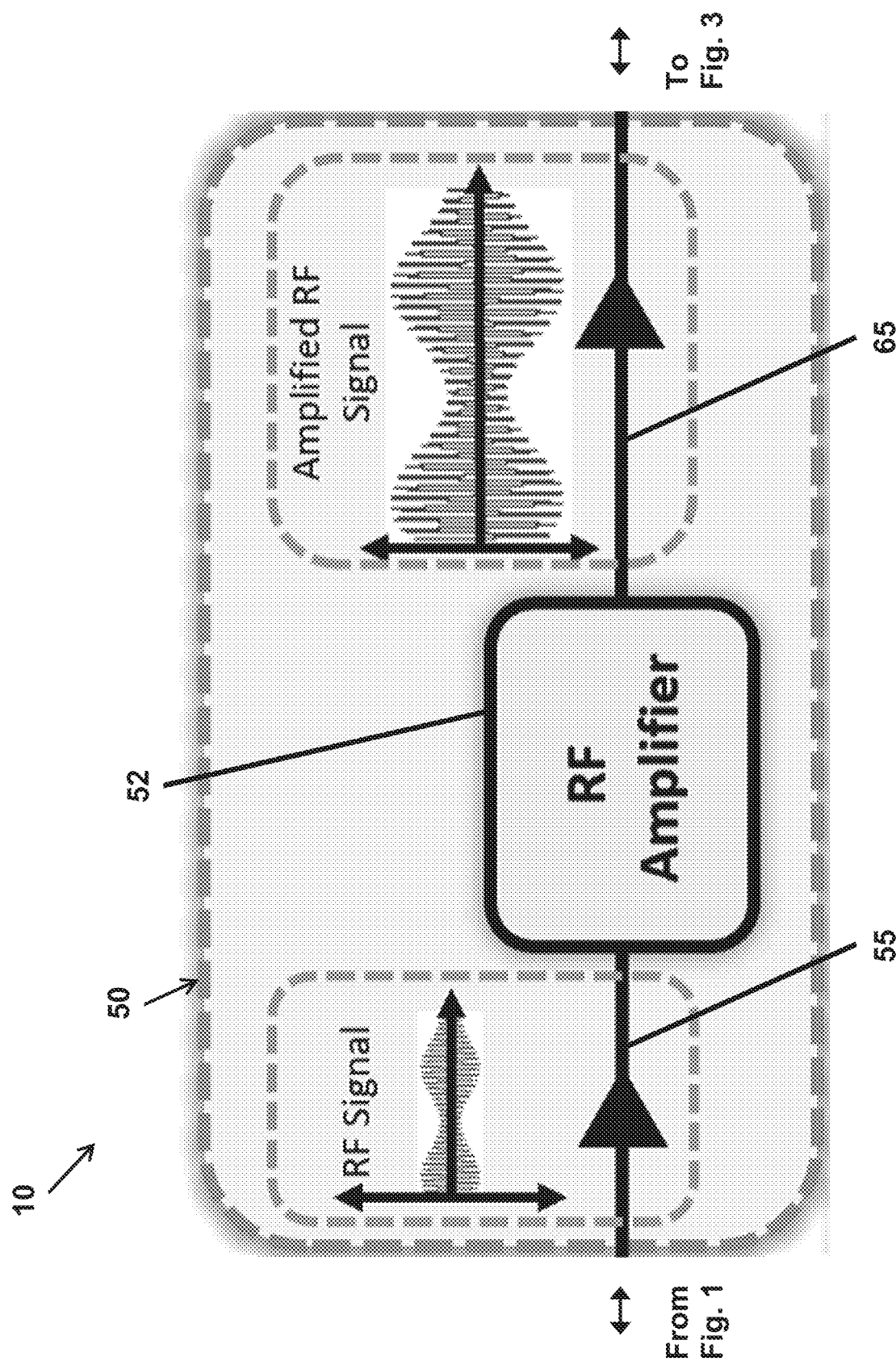
FIG. 2 is a schematic of a portion of the system according to one or more embodiments of the invention, showing an amplifying system.
Figure 3:
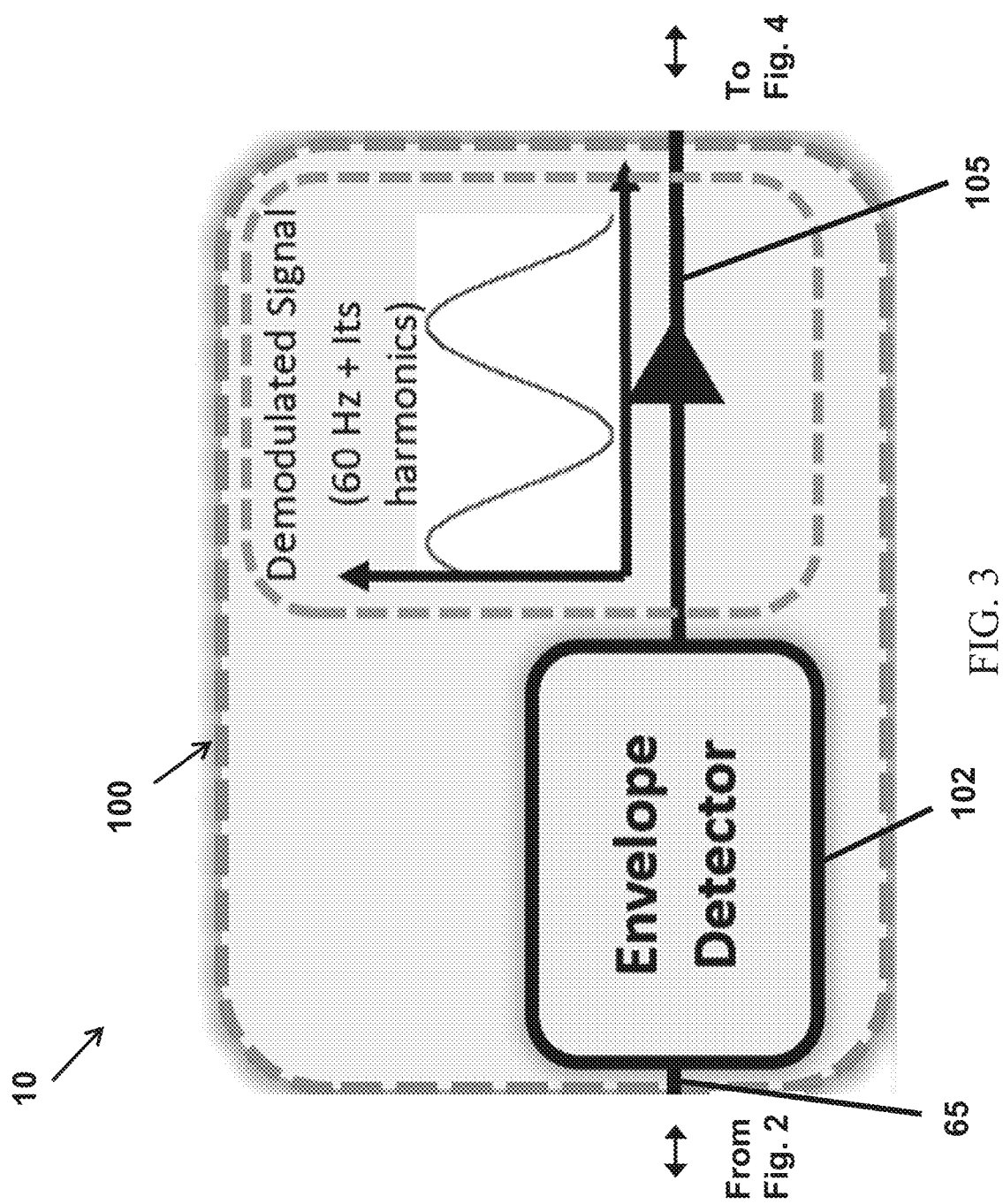
FIG. 3 is a schematic of a portion of the system according to one or more embodiments of the invention, showing an envelope detector system.
Figure 4:
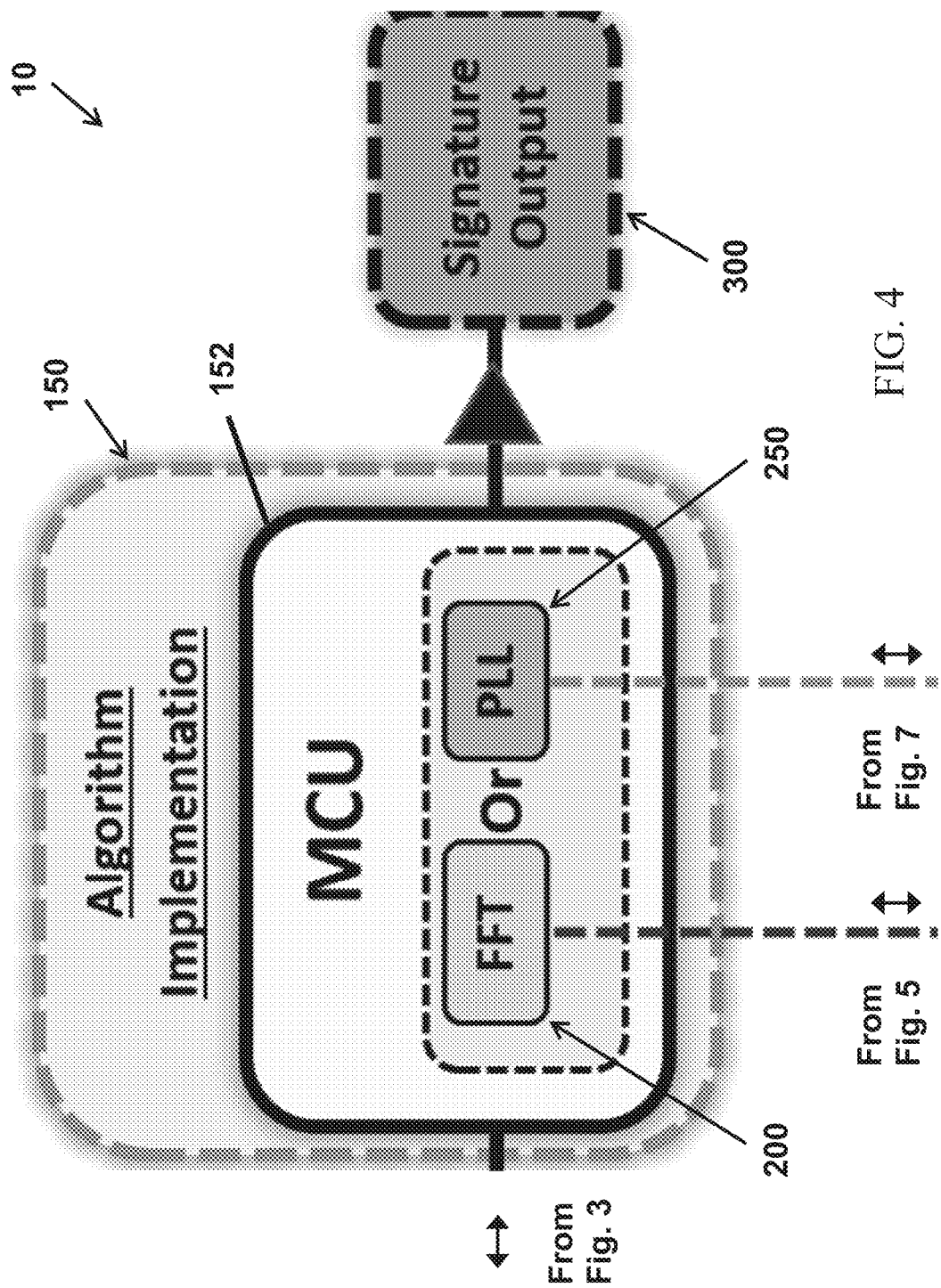
FIG. 4 is a schematic of a portion of the system according to one or more embodiments of the invention, showing an algorithm implementation system and a signature output.
Figure 5:
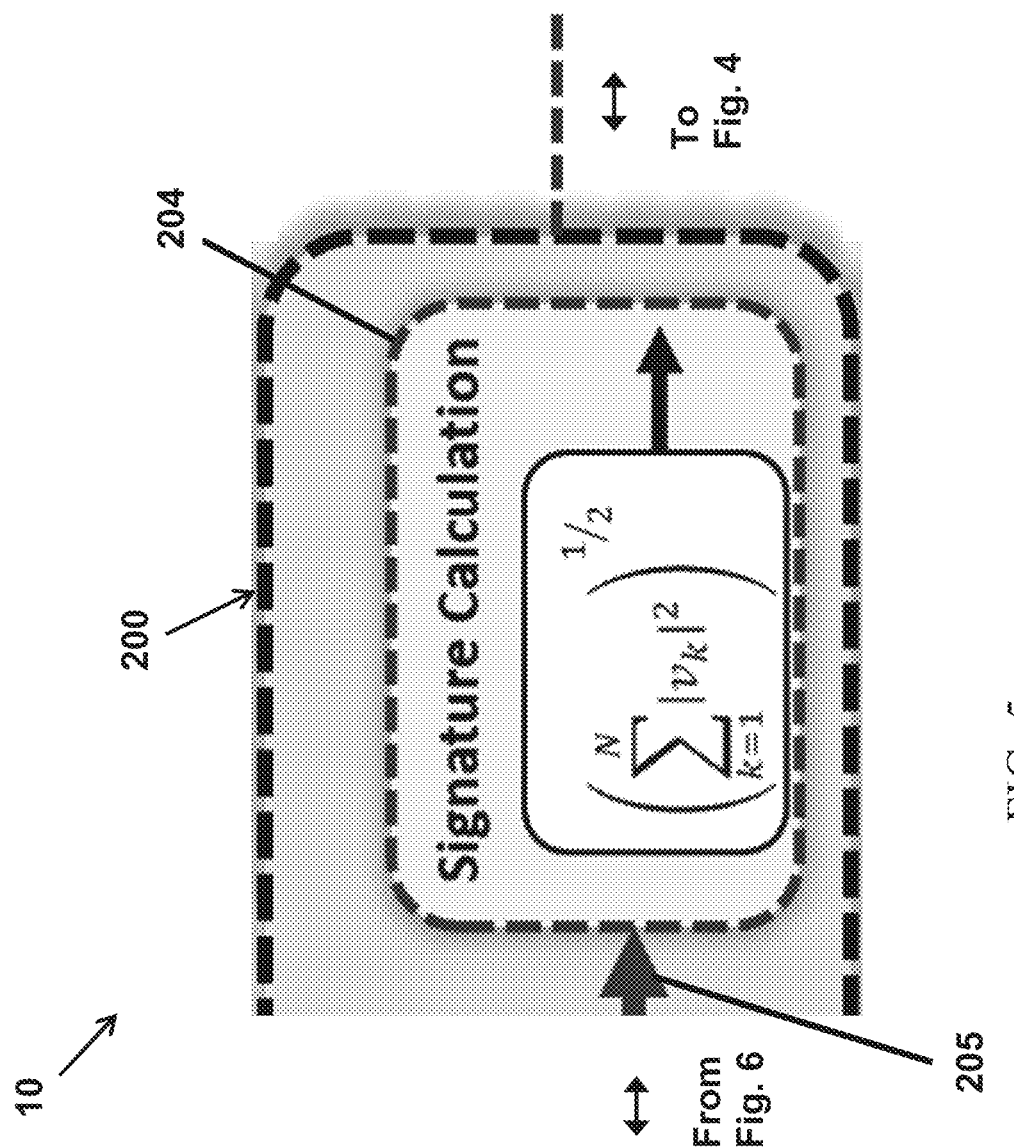
FIG. 5 is a schematic of a portion of the system according to one or more embodiments of the invention, showing a portion of a Fast Fourier transform (FFT) trigger system.

Embodiments of the present invention relate to a failure detection system for an energy network, such as via power line insulators of the energy network. The failure detection system measures radio frequency (RF) emissions of the energy network in order to detect partial discharge. The failure detection system may be particularly utilized to measure high frequency (e.g. greater than 100 KHz) RF emissions. In addition to providing predictive maintenance for energy networks or systems, the failure detection system may also provide predictive maintenance for AC and DC grids. One or more embodiments of the failure detection system may utilize a phase locked loop algorithm. One or more embodiments relate to a high frequency RF emissions envelope detector, which may be utilized to determine the partial discharge content from the RF emissions. Embodiments of the present invention may include a variety of components and possible system configurations. Advantageously, the failure detection system of the present invention provides a cost effective and quick failure detection system. One or more embodiments also advantageously detect the envelope of high frequency amplitude modulated radio frequency signals.

The failure detection system 10 for an energy network 14, which failure detection system 10 may also be referred to as a sensor system 10 or a sensor 10, is shown across FIGS. 1 to 16. The failure detection system 10 includes an RF receiver 12 and an amplifying system 50 that receives an amplitude modulated RF signal 55 from the RF receiver 12. The amplifying system 50 feeds an amplified signal 65 to an envelope detector system 100. The envelope detector system 100 feeds a demodulated envelope signal 105 to an algorithm implementation system 150. Where utilized, the algorithm implementation system 150 includes processing the demodulated envelope signal 105. The processing of the demodulated envelope signal 105 may be by one or more of a Fast Fourier transform (FFT) trigger system 200 and a phase-locked loop (PLL) trigger system 250. The algorithm implementation system 150 then outputs a signature output 300 that is the overall output of the failure detection system 10. In other embodiments, the demodulated envelope signal 105 may be the signature output 300. The various components of failure detection system 10 will now be further described.

Amplifying system 50, particularly RF receiver 12 thereof, is coupled with or in close proximity to the energy network 14, for example, one or more power line insulators 14, such that RF noise 15, which may also be referred to as RF emissions 15 or modulated signals 15, from the one or more power line insulators 14 can be received by RF receiver 12. When there is a fault in power line insulators 14, partial discharge (PD) occurs, giving rise to both RF and ultrasonic emissions. The RF emissions 15 propagate as amplitude modulated (AM) signals 15 where the modulating signal frequency may be either twice the grid frequency (e.g. 120 Hz), and/or exactly the grid frequency (e.g. 60 Hz). The presence of these grid frequency (e.g. 60 Hz and/or 120 Hz) modulating signals 15 is indicative of deterioration of the power line insulators 14. The grid frequency, which may also be referred to as fundamental frequency, may be any suitable frequency, such as 60 Hz or 50 Hz. To the extent that 60 Hz is a common grid frequency, any use or description of components herein relative to 60 Hz may also be considered as interchangeable with alternative grid frequencies.

While the AM signals might alternatively be collected by an AM receiver, which would aim to faithfully reproduce the transmitted signal, the utilization of RF receiver 12 is desirable for system 10. An objective is to detect the signal envelope only, rather than the entire signal. As such, one or more embodiments may be devoid of an AM receiver. As will be further discussed, system 10 utilizes a simple diode detector circuit to detect the envelope of the 60 Hz and/or 120 Hz signal from the high frequency RF emissions. Advantageously, the cost of the detector circuit is very low compared to market-available AM receivers. Moreover, the present detector circuit is also advantageous because market-available AM receivers can be bulky and consume considerable amounts of power, rendering them impractical. The present detector circuit is beneficial in these regards.

The RF receiver 12 receives the RF noise 15 and converts it to the amplitude modulated RF signal 55. The amplitude modulated RF signal 55 is then fed as an input to an RF amplifier 52, which may also be referred to as a pre-amplifier 52. RF amplifier 52 generates the amplified RF signal 65 as the input to the envelope detector system 100. RF amplifier 52 enhances the operation of system 10 by improving the quality of the signal and the detection accuracy.

RF receiver 12, which includes an antenna, may have any desired frequency range. The frequency range may be designed based on, for example, the details of energy system 14, the details of the antenna, and the bandwidth of RF amplifier 52. The frequency range may be up to 6 GHz. In one or more embodiments, the frequency range may be in a range of from 5 MHz to 3.5 GHz. In one or more embodiments, the frequency range may be in a range of from 500 MHz to 3.5 GHz, in other embodiments, from 0 to 512 MHz, in other embodiments, from 132 MHz to 512 MHz, in other embodiments, from 50 MHz to 500 MHz, and in other embodiments, from 50 MHz to 250.5 MHz. In one or more embodiments, the frequency range may be about 132 MHz, in other embodiments, about 135 MHz, in other embodiments, about 250.5 MHz, and in other embodiments, about 512 MHz.

RF receiver 12 may have any desired gain, which again may be based on the various factors listed above. In one or more embodiments, RF receiver 12 may have a unity gain.

RF receiver 12 may be generally characterized as having low noise. Moreover, the subsequent use of RF amplifier 52 is intended to improve the signal to noise ratio. The RF amplifier 52 amplifies the signal, but not the noise.

Figure 13:
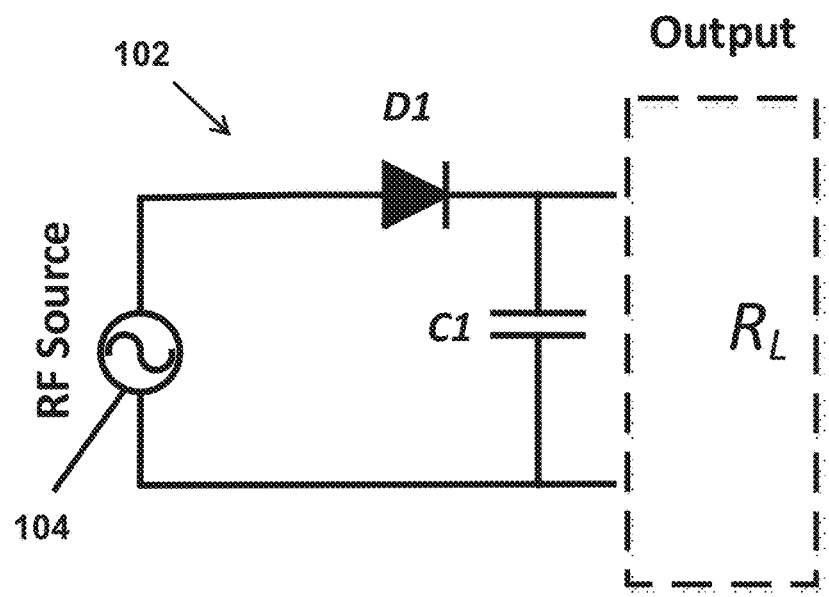
FIG. 13 is a block diagram of an envelope detector circuit according to one or more embodiments of the invention.
Figure 14:
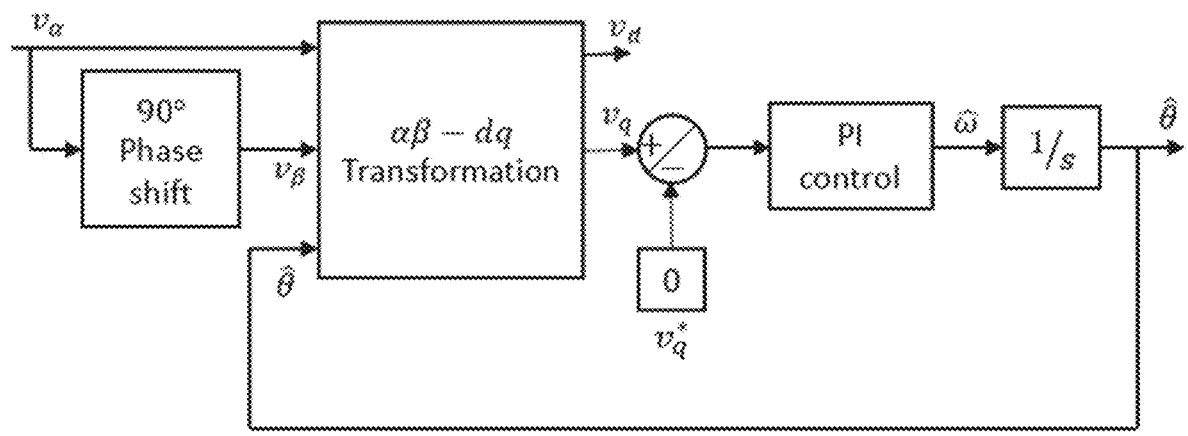
FIG. 14 is a block diagram of a single-phase phase locked loop (PLL) circuit according to one or more embodiments of the invention.

Envelope detector system 100 receives the amplified RF signal 65 with an envelope detector 102, which may also be referred to as the envelope detector circuit 102 or detector circuit 102. The envelope detector circuit 102 is shown in FIG. 13. The envelope detector circuit 102 receives an RF source 104, which may be amplified RF signal 65. Envelope detector 102 outputs the demodulated envelope signal 105 to the algorithm implementation system 150. The output of the envelope detector 102 may also be referred to as the envelope of the high frequency RF signal. Though not shown in the Figures, in one or more embodiments, the output 105 of the envelope detector 102 may be the signature output 300. In other embodiments, the output 105 of the envelope detector 102 may be used for further post analysis, such as in algorithm implementation system 150.

The envelope detector circuit 102 includes a diode D1, a capacitor C1, and a resistor $R_L$. Diode D1, capacitor C1, and resistor $R_L$ should be selected such that the detector circuit 102 can operate at the high frequency RF range in order to render the envelope detector circuit 102 is capable of capturing the envelope of high frequency RF emissions. The diode D1, capacitor C1, and resistor $R_L$ in combination should have coordinated bandwidths as to set up the bandwidth for envelope detector 102. The coordination of the diode D1, capacitor C1, and resistor $R_L$ should moreover match with the bandwidth requirements for the system 10. Diode D1 should have suitable switching performance. The forward voltage drop of diode D1 should be selected such that the signal to noise ratio can be matched to maintain resolution. If the signal is low, and voltage forward drop is low, then the signal will have to be amplified high enough such that forward voltage drop is lower compared to the signal. The frequency range should be matched with capacitor C1 and resistor $R_L$.

It should be appreciated that the number of components required to build envelope detector circuit 102 is minimal compared to those needed for conventional AM receivers. Moreover, envelope detector circuit 102 is less costly, is smaller, and consumes less power than conventional AM receivers. Envelope detector circuit 102 may also be said to replace a conventional RF detector. As such, one or more embodiments may be devoid of an assembly conventionally described as an RF detector.

In one or more embodiments, the envelope detector circuit 102 consists essentially of diode D1, capacitor C1, and resistor $R_L$, which may be described as only including those components necessary for detecting high frequency RF emissions and/or as lacking those components that would otherwise be utilized to detect an AM signal. That is, the envelope detector circuit 102 advantageously detects high frequency RF signal. In one or more embodiments, the envelope detector circuit 102 consists of diode D1, capacitor C1, and resistor $R_L$.

As further description of diode D1, diode D1 can be single diode. Though not shown in the Figures, in other embodiments, diode D1 may be a double diode. An exemplary single diode D1 is BAT 63-02V H6327 from Infineon. An exemplary double diode D1 is BAT 15-04 W H6327 from Infineon.

Diode D1 may have any desired frequency range, which again may be based on the various factors listed above. The particular frequency ranges disclosed above relative to RF receiver 12 are also incorporated here relative to diode D1. A relatively higher frequency may be utilized for the ability to switch faster than the bandwidth of the system.

Diode D1 may have any desired forward voltage drop. A relatively lower forward voltage drop may be desirable, which is generally the reason for utilizing the RF amplifier 52. In one or more embodiments, the forward voltage drop of diode D1 is up to 0.32 V, in other embodiments, up to 0.19 V, in other embodiments, from 0.19 V to 0.32 V, in other embodiments, about 0.19 V, and in other embodiments, about 0.32 V.

As further description of capacitor C1, capacitor C1 may have relatively low equivalent series resistance. Capacitor C1 may be an AC capacitor. An exemplary capacitor C1 is RDE5C3A102J2M1H03A from Murata.

As further description of resistor $R_L$, resistor $R_L$ may have relatively low inductance or no inductance. An exemplary resistor $R_L$ is CFR-50JR-52-1M from Yageo.

As suggested above, where utilized, the algorithm implementation system 150 includes processing the demodulated envelope signal 105, which may be by one or more of a Fast Fourier transform (FFT) trigger system 200 and a phase-locked loop (PLL) trigger system 250. The algorithm implementation system 150 includes a microcontroller unit (MCU) 152, which is generally a small computer on a semiconductor integrated circuit chip. The MCU 152 processes the algorithm of the FFT trigger system 200 and the PLL trigger system 250, as applicable. Suitable details of the microcontroller unit 152 are generally known to the skilled person.

Whether the FFT trigger system 200 or PLL trigger system 250 is utilized may be based on the desired properties. The PLL trigger system 250 will generally provide a faster response, such as if high dynamic is needed. The PLL trigger system 250 will also generally require lower power compared to FFT trigger system 200. The FFT trigger system 200 will generally provide higher accuracy.

FFT trigger system 200 utilizes a fast Fourier transform algorithm. The demodulated envelope signal 105 is provided to a system 202 for processing the magnitudes and phases of n harmonics. The outlet signal 205 of system 202 is then provided to a signature calculation 204. The signature calculation 204 technique may be a 2-norm calculation, which may also be referred to as a sum-of-squares calculation. Utilizing the 2-norm calculation for signature calculation 204 may be said to enhance the effects of the more significant components, reduce the effects of the less significant components and noise, and ease the computational effort. The signature calculation 204 output can then become the signature output 300.

Figure 6:
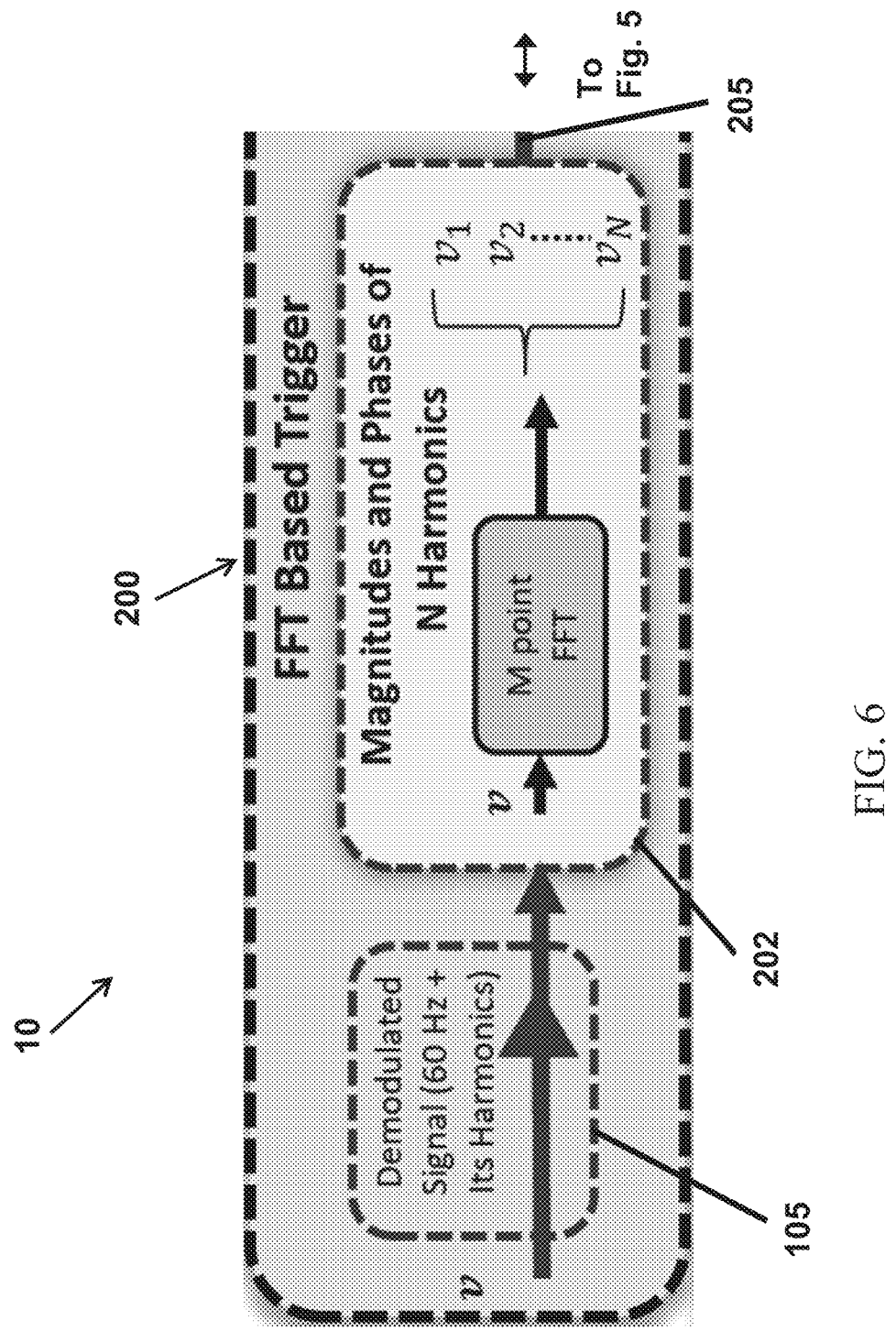
FIG. 6 is a schematic of a portion of the system according to one or more embodiments of the invention, showing a portion of the FFT trigger system.
Figure 7:
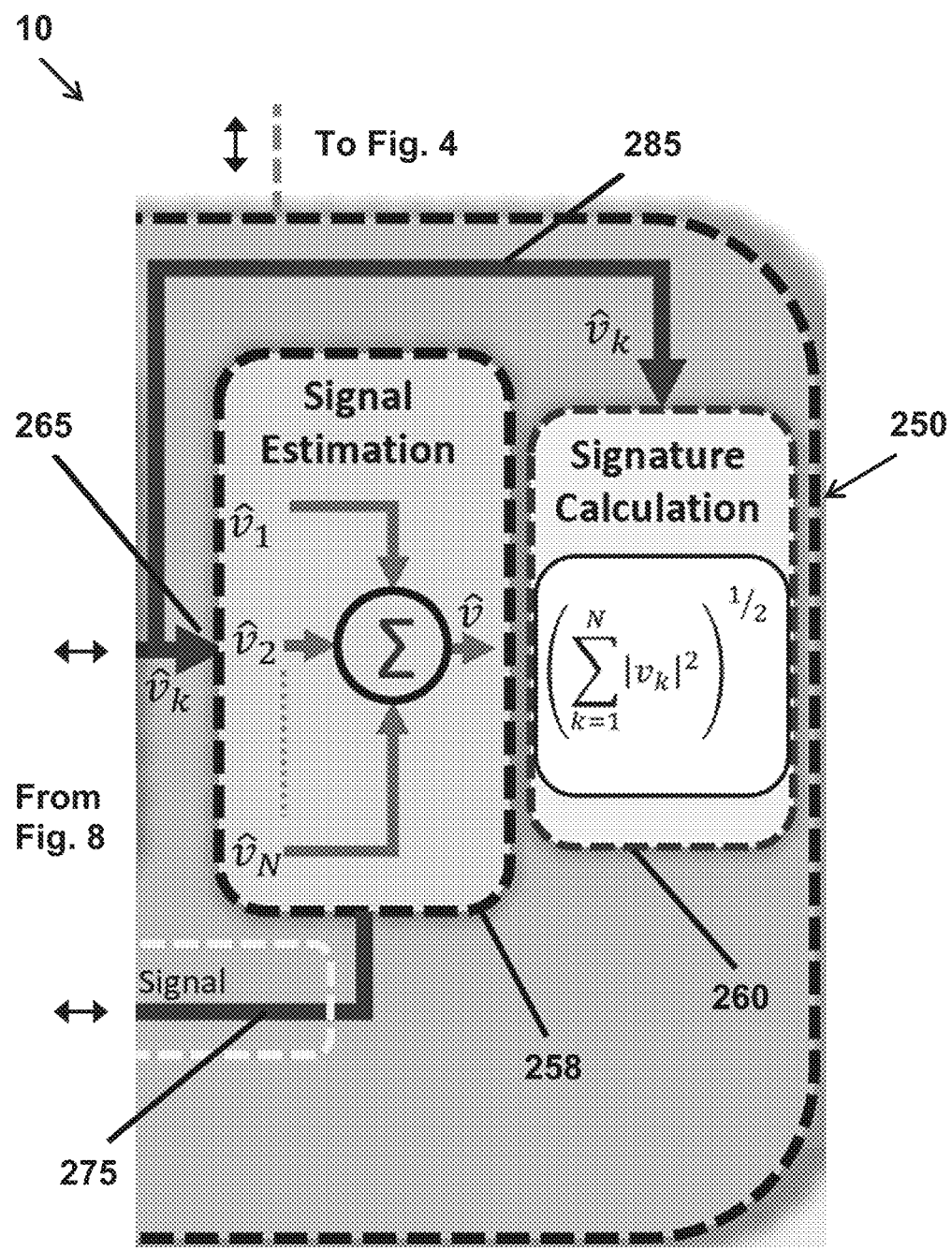
FIG. 7 is a schematic of a portion of the system according to one or more embodiments of the invention, showing a portion of a phase-locked loop (PLL) trigger system.
Figure 8:
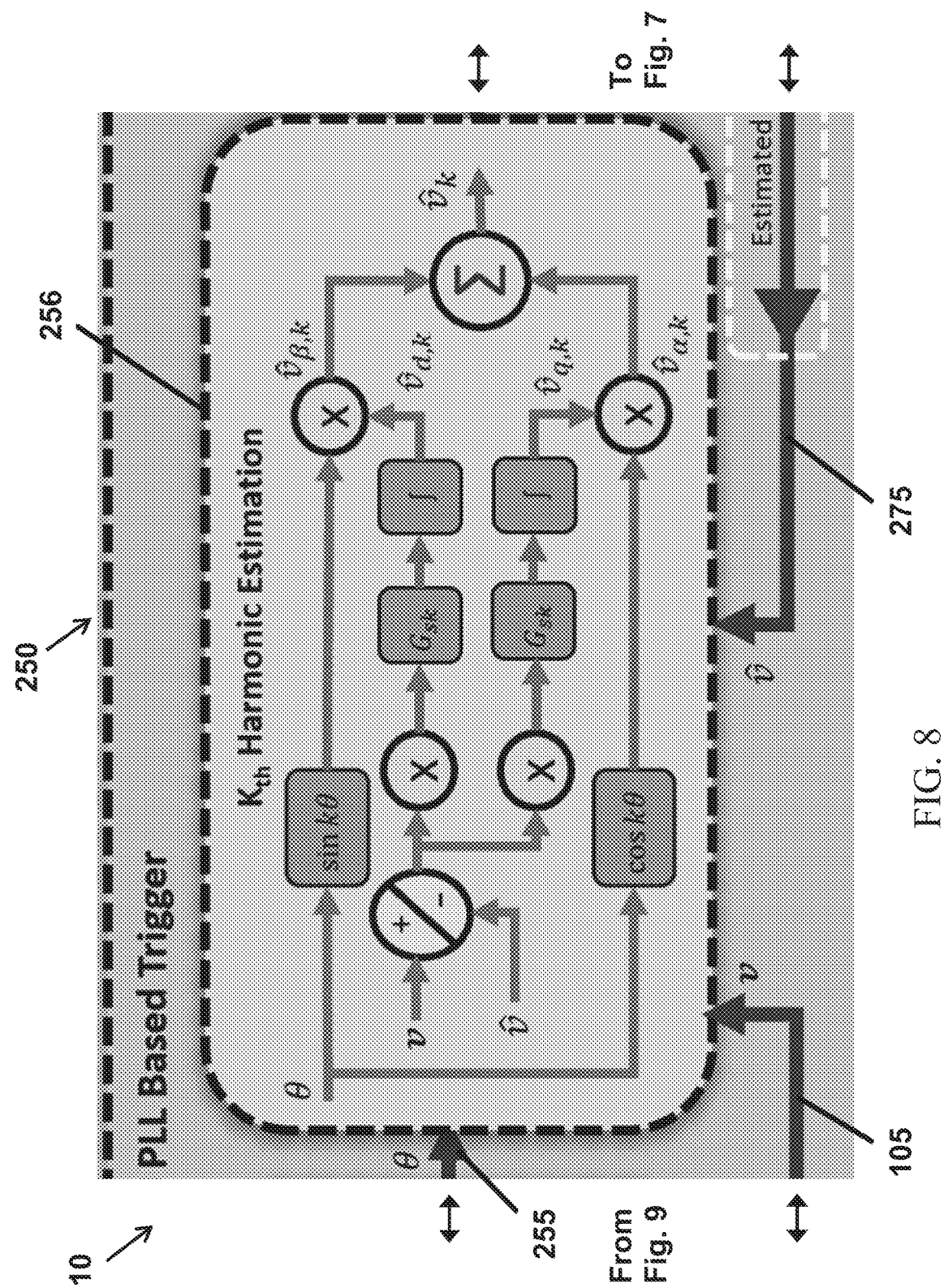
FIG. 8 is a schematic of a portion of the system according to one or more embodiments of the invention, showing a portion of the PLL trigger system.
Figure 9:
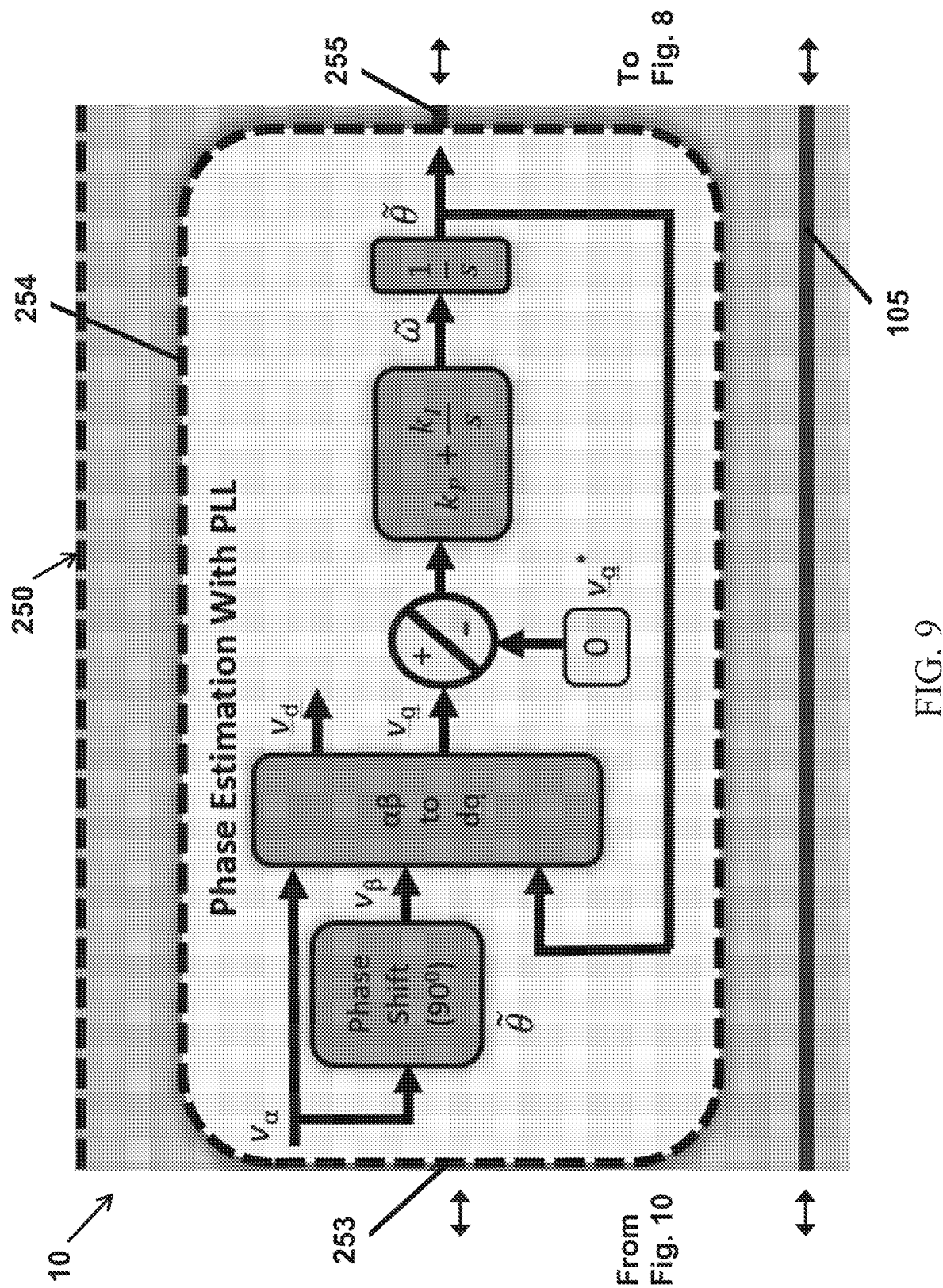
FIG. 9 is a schematic of a portion of the system according to one or more embodiments of the invention, showing a portion of the PLL trigger system.
Figure 10:
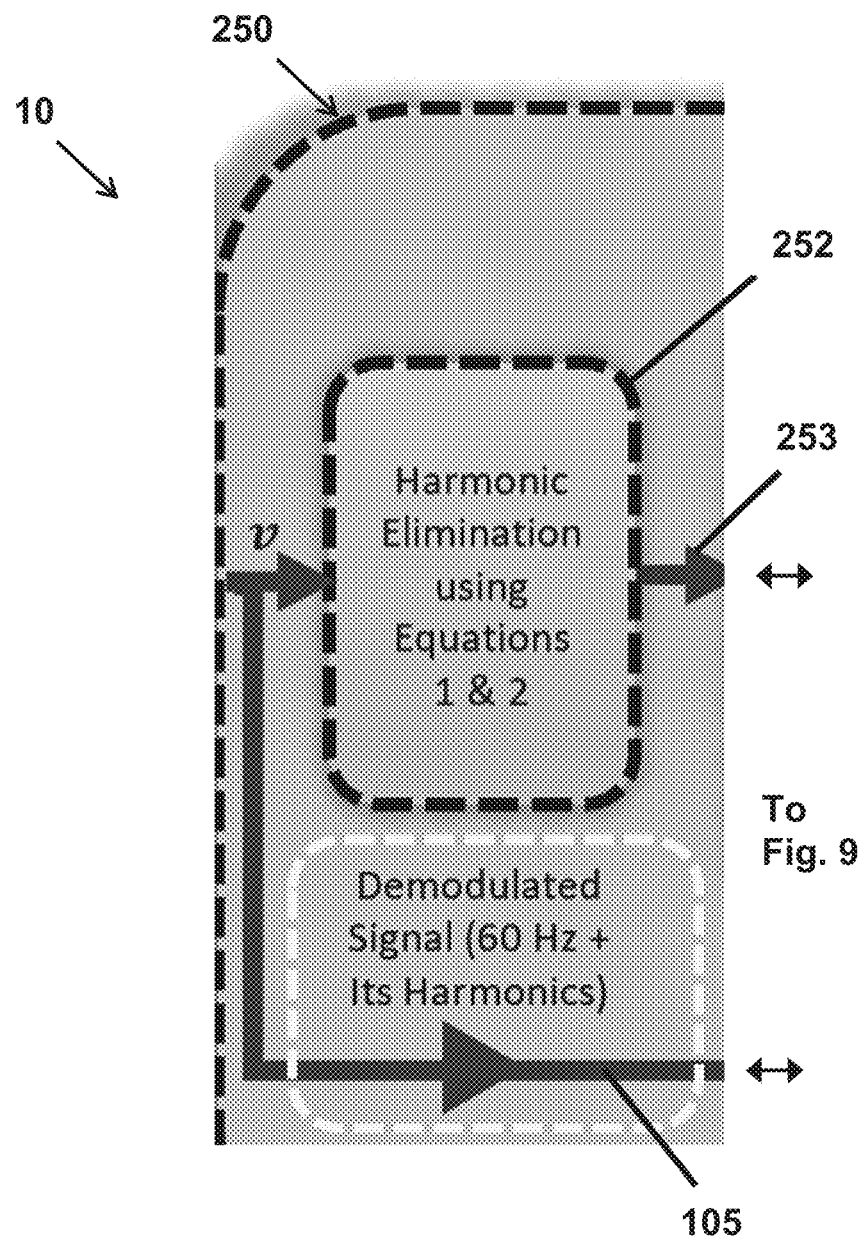
FIG. 10 is a schematic of a portion of the system according to one or more embodiments of the invention, showing a portion of the PLL trigger system.

Suitable FFT algorithms and other relevant details thereof are generally known to the skilled person. As shown in FIG. 6, an exemplary FFT is an M point FFT, where M refers to the number of samples.

PLL trigger system 250 utilizes a phase-locked loop (PLL) control system. A PLL system is generally known to generate an output signal whose phase is related to the phase of an input signal. PLL based system 250 is a computationally simple signal processing algorithm for estimating and detecting the harmonic components of RF emissions 15. PLL based system 250 with system 10 allows for real time implementation of the sensor system 10 to detect the component failures of the energy system 14. PLL based system 250 provides fast, accurate, and simple computation for the harmonic content of the RF emissions 15.

The PLL of PLL based system 250 is an efficient method to detect a signal phase, amplitude, and frequency. The phase detected by the PLL is used in this approach to estimate the frequency (harmonics) components. As the power line noise 15 is associated with several harmonics, the effect of the harmonics is eliminated in a system 252 before the phase estimation system 254. This is because the harmonics disturb the performance of the PLL. This also adds oscillations to the estimated phase. PLL based system 250 combines the use of the PLL and mixed estimation error integral (MEEI) algorithm to determine the harmonic content of the radio frequency emissions. PLL based system 250 involves a closed-loop feedback process that estimates the harmonic components individually. PLL based system 250 may require fewer mathematical computations compared to conventional signal processing methods.

Within PLL trigger system 250, the demodulated envelope signal 105 is first provided. A portion of the demodulated envelope signal 105 is provided to harmonics elimination system 252. A portion of the demodulated envelope signal 105 is provided to $K_{th}$ harmonics estimation system 256.

Within harmonics elimination system 252, equation 1 (Eq. 1; FIG. 11) and equation 2 (Eq. 2; FIG. 12) are applied to the portion of demodulated envelope signal 105. This provides an output signal 253, which is a single-phase signal 253, that is provided to phase estimation system 254.

Within phase estimation system 254 (FIG. 14), single-phase signal 253 is transformed into two stationary reference frame components, as shown in Equations (3) and (4):

$$v_\alpha = v_m \cos\theta \quad \text{Equation (3)}$$

$$v_\beta = v_m \sin\theta \quad \text{Equation (4)}$$

where, $v_m$ is the peak voltage of the signal and $\theta$ is the phase angle of the input reference voltage signal.

$v_\alpha$ and $v_\beta$ are then transformed into a rotating reference frame using the park transformation as:

$$\begin{bmatrix} v_d \\ v_q \end{bmatrix} = \begin{bmatrix} v_m \cos(\theta - \hat{\theta}) \\ v_m \sin(\theta - \hat{\theta}) \end{bmatrix} \quad \text{Equation (5)}$$

where, $\hat{\theta}$ is the estimated phase from the PLL and $v_d$ and $v_q$ are the rotating reference frame components.

With reference again to FIG. 14, the estimated phase $\hat{\theta}$ is made equal to the reference phase $\theta$ to lock the phase accurately by selecting the appropriate $k_p$ and $k_i$ coefficients for the PI filter (control). The phase error cannot be controlled directly, as $\theta$ (s) is unknown. So, the error is controlled by finding $v_q$ with the dq0-transformation and using it as an indirect feedback to equate it to the reference $v_q^*$ value, which is zero.

Within $K_{th}$ harmonics estimation system 256 (FIG. 15), the phase from the PLL and phase estimation system 254 is subjected to a mixed estimation error integral (MEEI) approach.

Figure 15:
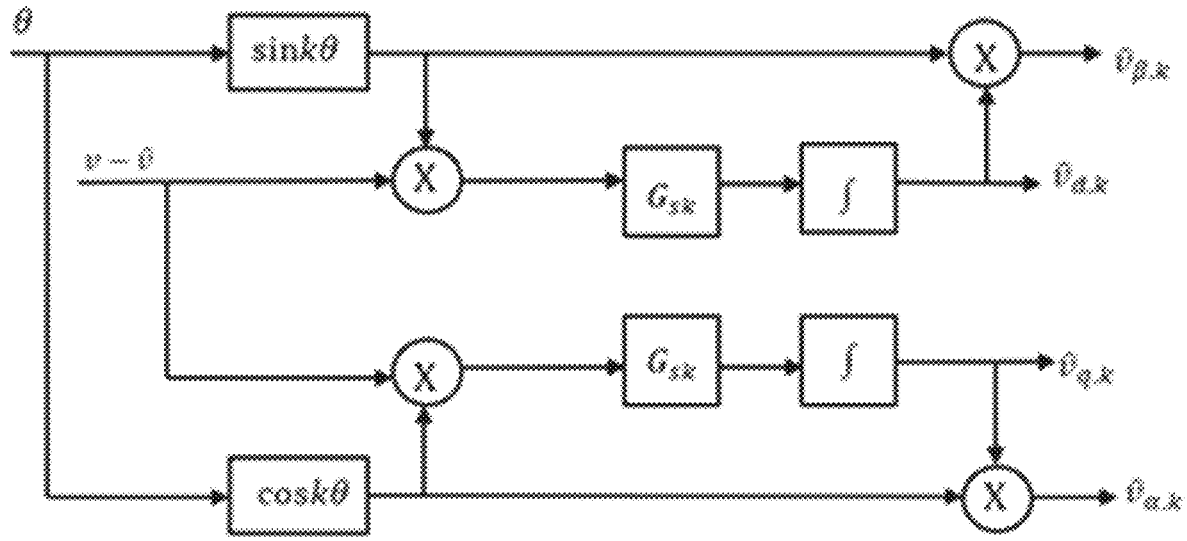
FIG. 15 is a block diagram of a mixed estimation error integral (MEEI) circuit according to one or more embodiments of the invention.

Consider the power line noise distorted with harmonics:

$$v(t) = \Sigma_{k=1}^n [v_k \cos\varnothing_k \sin(k\omega t) + v_k \sin\varnothing_k \cos(k\omega t)] \quad \text{Equation (6)}$$

where $v_k \cos\varnothing_k$; $v_k \sin\varnothing_k$ are considered as $\hat{v}_{d,k}$ and $\hat{v}_{q,k}$ which are the estimates of $v_{d,k}$ and $v_{q,k}$ for the $k^{th}$ harmonic components. A simple and efficient method is proposed for the estimation based on the MEEI approach as shown in FIG. 15, where the error between the input signal and the reconstructed signal is calculated and integrated to estimate individual harmonics, as $$\hat{v}_{d,k}(t) = G_{s,k}(v - \hat{v})\sin(k\theta) \quad \text{Equation (7)}$$

where $(v - \hat{v})$ is the error between the actual input signal and the reconstructed signal.

The cosine component for the $k^{th}$ harmonic component is represented in a manner similar to that of the sine component as $$\hat{v}_{q,k}(t) = G_{s,k}(v - \hat{v})\cos(k\theta) \quad \text{Equation (8).}$$

With reference again to FIG. 15, the reconstructed signal can be given by $$\hat{v} = \Sigma_{k=1}^m (\hat{v}_{d,k}(t)\sin(k\theta) + \hat{v}_{q,k}(t)\cos(k\theta)) \quad \text{Equation (9)}$$

where k=1, 2, 3, . . . m is the number of harmonic components, $\hat{v}_{d,k}(t) \sin(k\theta)$ and $\hat{v}_{q,k}(t) \cos(k\theta)$ are $\hat{v}_{\beta,k}(t)$ and $\hat{v}_{\alpha,k}(t)$ respectively.

The harmonics are estimated individually using the simple mathematical operations as presented in Equation (7) and Equation (8). The method requires much less time and computational complexity than those of conventional FFT methods.

Figure 16:
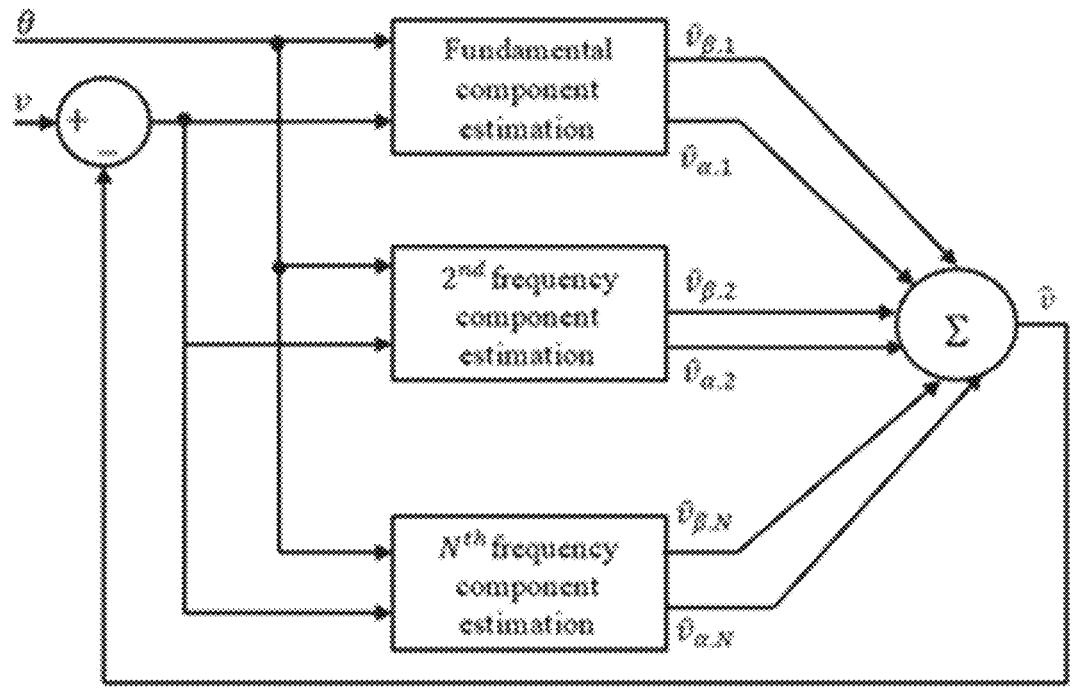
FIG. 16 is a block diagram of an estimation of all harmonic components according to one or more embodiments of the invention.

FIG. 16 shows the overall estimation of all the harmonic components. That is, an MEEI circuit (FIG. 15) may be utilized for each harmonic component of the signal, to then arrive at the overall estimation of all the harmonic components (FIG. 16).

A portion 265 of the $K_{th}$ harmonics estimation output signal may be provided to a further signal estimation system 258. The various components of the signal 265 are averaged to arrive at an estimated signal 275. The estimated signal 275 is then provided back to $K_{th}$ harmonics estimation system 256 as an input. A portion 285 of the $K_{th}$ harmonics estimation output signal is then provided to a signature calculation 260. The signature calculation 260 technique may be a 2-norm calculation, which may also be referred to as a sum-of-squares calculation. Utilizing the 2-norm calculation for signature calculation 260 may be said to enhance the effects of the more significant components, reduce the effects of the less significant components and noise, and ease the computational effort. The signature calculation 260 output can then become the signature output 300.

As mentioned above, the signature output 300 is the overall output of the failure detection system 10. As suggested above, the signature output 300 can vary based on the earlier stages of the failure detection system 10. As discussed elsewhere herein, the signature output 300 can be analyzed to determine whether there is partial discharge within power line insulators 14.

As suggested above, system 10 utilizes estimated RF frequency components to detect the electrical equipment deterioration in a power system. Equipment deterioration will be reported if the estimated harmonic component magnitudes of RF noise 15 exceed the pre-determined threshold. That is, while one or more aspects of a method of operation are disclosed above, embodiments of a method of operating system 10 may further include establishing a predetermined setpoint of the energy system 14, and then comparing the signature output 300 to the predetermined setpoint of the energy system 14. The predetermined setpoint of the energy system 14 may be an amount of RF noise 15 and/or the presence of and/or an amount of partial discharge.

It should be appreciated that the above described components are in suitable communication with one another, which may be any suitable physical communication or wireless communication, where appropriate. In one or more embodiments, sensor system 10 is provided on energy system 14 and sends data (e.g. signature output 300) wirelessly to the cloud. It should also be appreciated that sensor system 10 may include any necessary electronic components and physical components (e.g. a housing) for operation as generally known to the skilled person.

Where utilized, the number of harmonics considered may be any suitable number. In one or more embodiments, only the first five harmonics of a grid frequency (e.g. 60-Hz, 120-Hz, 180-Hz, 240-Hz, 300-Hz) are considered. In other embodiments, only the first four harmonics are considered, in other embodiments, only the first six harmonics are considered, and in other embodiments, only the first eight harmonics are considered. In one or more embodiments, only the first five harmonics are considered for the Fast Fourier Transform (FFT) calculation. In one or more embodiments, any of the above listed numbers of harmonics considered may include considering that number and fewer than that number. For example, in one or more embodiments, the first five or fewer harmonics may be considered. The use of only a certain lower number of harmonics may allow the use of a relatively low sampling frequency, such as about 2 kHz, thereby resulting in high efficiency, with fewer computations, and low power consumption.

In light of the foregoing, it should be appreciated that the present invention significantly advances the art by providing an improved failure detection system for an energy network. While particular embodiments of the invention have been disclosed in detail herein, it should be appreciated that the invention is not limited thereto or thereby inasmuch as variations on the invention herein will be readily appreciated by those of ordinary skill in the art. The scope of the invention shall be appreciated from the claims that follow.

What is claimed is:

1. A failure detection system for an energy network, the failure detection system comprising
   a radio frequency (RF) receiver adapted to be coupled with or in close proximity to the energy network, the RF receiver providing an amplitude modulated RF signal;
   an RF amplifier receiving the amplitude modulated RF signal and providing an amplified signal;
   an envelope detector receiving the amplitude modulated RF signal and providing a demodulated envelope signal;
   an optional algorithm implementation system receiving the demodulated envelope signal, where the optional algorithm implementation system processes the demodulated envelope signal by one or more of a Fast Fourier transform (FFT) trigger system and a phase-locked loop (PLL) trigger system; and
   a signature output that is the overall output signal of the failure detection system, wherein the signature output is adapted to indicate whether the energy network is experiencing partial discharge.

2. The failure detection system of claim 1, wherein the algorithm implementation system is present.

3. The failure detection system of claim 2, wherein the algorithm implementation system processes the demodulated envelope signal by the FFT trigger system.

4. The failure detection system of claim 3, wherein FFT trigger system includes a system for processing the magnitudes and phases of n harmonics providing an output signal to an FFT signature calculation, wherein the FFT signature calculation includes a 2-norm calculation.

5. The failure detection system of claim 2, wherein the algorithm implementation system processes the demodulated envelope signal by the PLL trigger system.

6. The failure detection system of claim 5, wherein the PLL trigger system includes a harmonic elimination system providing a first output signal to a phase estimation system, and the phase estimation system providing a second output signal to a $K_{th}$ harmonics estimation system.

7. The failure detection system of claim 6, wherein the PLL trigger system includes the $K_{th}$ harmonics estimation system providing a first portion of a third output signal to a signal estimation system and a second portion of the third output signal to a PLL signature calculation, wherein the PLL signature calculation includes a 2-norm calculation, wherein the signal estimation system provides a fourth output signal back to the $K_{th}$ harmonics estimation system.

8. The failure detection system of claim 1, wherein the failure detection system is devoid of an AM receiver and wherein the failure detection system is devoid of an RF detector.

9. The failure detection system of claim 1, wherein the energy network utilizes a grid frequency having a first five harmonics, and wherein the failure detection system considers only the first five harmonics or fewer than the first five harmonics.

10. The failure detection system of claim 9, wherein the grid frequency is 60-Hz such that the first five harmonics of the grid frequency are 60-Hz, 120-Hz, 180-Hz, 240-Hz, and 300-Hz, and wherein the failure detection system considers only the first five harmonics.

11. The failure detection system of claim 1, wherein the envelope detector comprises a diode, a capacitor, and a resistor.

12. The failure detection system of claim 11, wherein the envelope detector detects high frequency radio frequency (RF) emissions from the energy network.

13. The failure detection system of claim 1, wherein the envelope detector consists of a diode, a capacitor, and a resistor.

14. An envelope detector for determining partial discharge content from an energy network, the envelope detector consisting essentially of a diode, a capacitor, and a resistor,
   wherein the envelope detector detects high frequency radio frequency (RF) emissions from the energy network; where the diode is in series with the high frequency RF emissions as an incoming RF input, and where the capacitor is connected across a load of the envelope detector.

15. The envelope detector of claim 14, the envelope detector consisting of the diode, the capacitor, and the resistor.

* * * * *